US006602733B2

(12) United States Patent
Iwahashi et al.

(10) Patent No.: US 6,602,733 B2
(45) Date of Patent: Aug. 5, 2003

(54) METHOD FOR FABRICATING ELECTRONIC CIRCUIT DEVICE, SEMICONDUCTOR DEVICE AND ELECTRONIC CIRCUIT DEVICE INCLUDING BUMP BONDING

(75) Inventors: Shinji Iwahashi, Kanagawa (JP); Junichi Sekine, Kanagawa (JP); Hiroshi Yamasaki, Kanagawa (JP)

(73) Assignee: Sony Corporation (JP)

( * ) Notice: Subject to any disclaimer, the term of this patent is extended or adjusted under 35 U.S.C. 154(b) by 109 days.

(21) Appl. No.: 09/783,021

(22) Filed: Feb. 15, 2001

(65) Prior Publication Data

US 2001/0051396 A1 Dec. 13, 2001

(30) Foreign Application Priority Data

| Feb. 18, 2000 | (JP) | 2000-046821 |
| Aug. 11, 2000 | (JP) | 2000-249206 |

(51) Int. Cl.⁷ .................... H01L 21/44; H01L 21/48; H01L 21/50
(52) U.S. Cl. .................. 438/108; 438/109; 438/120; 438/123; 438/612; 438/613
(58) Field of Search ................. 438/108, 109, 438/118, 119, 120, 123, 127, 614, 612, 613

(56) References Cited

U.S. PATENT DOCUMENTS 6,181,145 B1 * 1/2001 Tomita 6,399,419 B1 * 6/2002 Shibata et al.

FOREIGN PATENT DOCUMENTS

JP 2001127104 A * 5/2001

* cited by examiner

Primary Examiner—John F. Niebling
Assistant Examiner—Ron Pompey
(74) Attorney, Agent, or Firm—Rader, Fishman & Grauer PLLC; Ronald P. Kananen

(57) ABSTRACT

A method for fabricating an electric circuit device able to ensure bonding strength and bond bumps without occurrence of cratering or other mechanical damages.

The method for fabricating an electric circuit device wherein a semiconductor device having a plurality of bumps formed in an approximate polygonal shape or others on a semiconductor chip so as to be connected with the circuit pattern of a semiconductor chip is mounted on a mounting board including electrodes formed on a board made of glass-epoxy based or other materials, comprises steps of, first, aligning the bumps with the electrodes and placing the semiconductor device on the mounting board, then while pressing from the upside of the semiconductor device to make the bumps and electrodes contact closely, applying ultrasonic vibration to the semiconductor device with the application direction $D_v$ to be the direction of a diagonal of the semiconductor chip or a direction not parallel with any side of the approximate polygon formed by the arranged bumps, and fusing the bumps and electrodes by the generated heat.

7 Claims, 21 Drawing Sheets

FIG. 9A
FIG. 9B
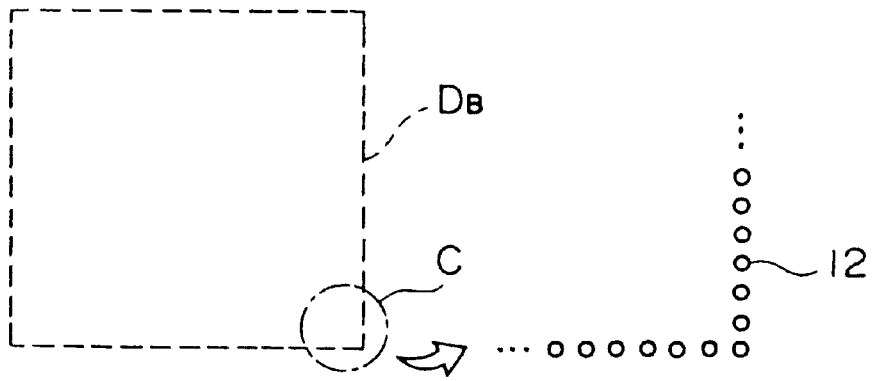
FIG. 9C
FIG. 9D
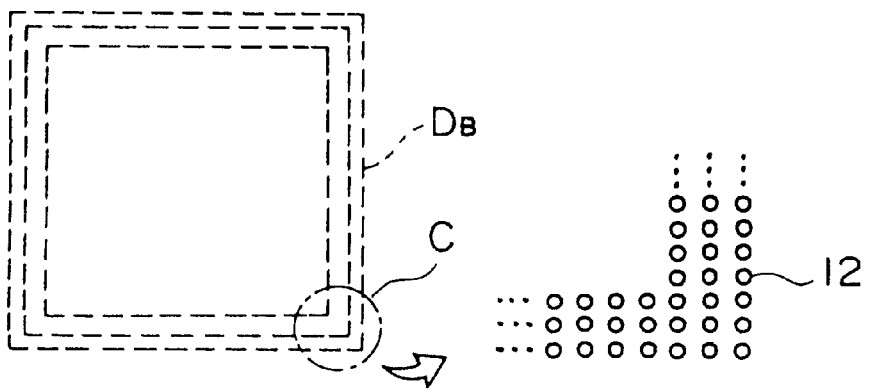
FIG. 9E
FIG. 9F
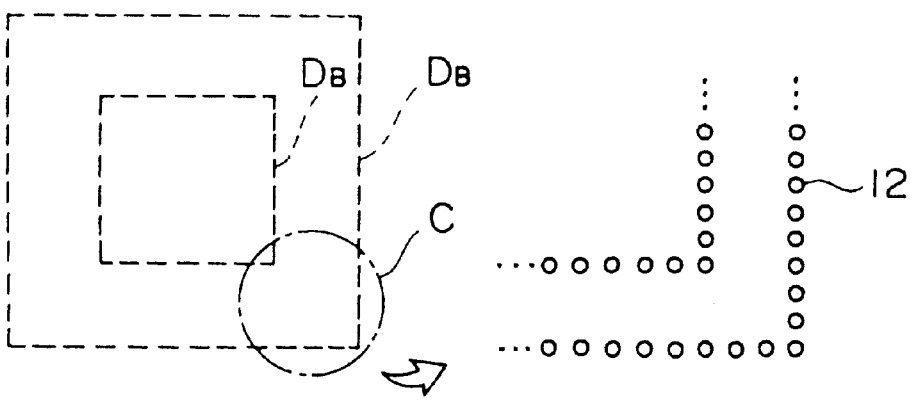

$x_1, x_2, x_3 \text{ --- } > X$

METHOD FOR FABRICATING ELECTRONIC CIRCUIT DEVICE, SEMICONDUCTOR DEVICE AND ELECTRONIC CIRCUIT DEVICE INCLUDING BUMP BONDING

BACKGROUND OF THE INVENTION

1. Field of the Invention

The present invention relates to a method for fabricating an electric circuit device, and to a semiconductor device and an electric circuit device, more specifically, to a method for fabricating an electric circuit device including a semiconductor device having a package form of a small size and high density and mounted on a mounting board, and to a semiconductor device involved in the method, and an electric circuit device obtained with the same method.

2. Descriptions of the Related Art

While requirements become stronger and stronger for reducing sizes, thicknesses and weights of digital video cameras, digital cellular telephones, or portable personal computers, or other portable electric apparatuses, recent VLSI semiconductor devices have been reduced by 30% in size during three years to respond to these requirements. On the other hand, it has been studied and developed as an important subject how the packing density of parts on a mounting board can be increased.

Conventionally, as package forms of semiconductor devices, use has been made of the through-hole mounting type (THD: Through Hole Mount Device) such as DIP (Dual In-line Package) or PGA (Pin Grid Array), etc., which involve mounting by inserting lead wires into through-holes provided on a printed wiring board, or the surface mounting type (SMD: Surface Mount Device) such as QFP (Quad Flat Package) or TCP (Tape Carrier Package), etc., which involve mounting by soldering lead wires onto the surface of a printed wiring board.

Moreover, for reducing size and increasing device density, the device package form has been shifted to so-called Chip Size Package (CSP, also called as FBGA (Fine-Pitch BGA)) whose package size is gradually approaching the size of a semiconductor chip.

For realizing devices further decreased in size and further increased in density, a method of mounting bare chips on a mounting board has been developed.

In the bare chip assembly technique, there are a COB form (Chip On Board) which involves die bonding a semiconductor chip on a mounting board with its electrode forming surface to be the upper surface, and electrically connecting electrodes of the semiconductor chip with electrodes of the mounting board by wire bonding, and a flip chip form which involves forming bumps (projecting electrode) on the chip electrodes in advance, and electrically and mechanically connecting the electrodes of the semiconductor chip with the electrodes of the mounting board by the bumps in a face-down manner with the bump forming surface facing the mounting board.

In the flip chip form, the method of forming bumps on a semiconductor chip is roughly divided into a stud bump method using gold or others and solder bump method. Stud bumps are formed on the semiconductor chip by wire bonding using gold or other wires, on the other hand, solder bumps are formed by plating, vapor deposition, ball transfer and so on.

The stud bump method is mainly applied to semiconductor chips in each of which pads are formed near the periphery of the circuit pattern so as to surround the periphery, so-called peripheral pad semiconductor chips, while, in addition to the above peripheral pad semiconductor chips, the solder bump method is widely applied to semiconductor chips including those each having pads arranged in the entire chip area.

A method has been developed for forming bump bonding by means of applying ultrasonic vibration to a semiconductor chip or a mounting board while pressing the semiconductor chip that has bumps formed by the stud bump method or the solder bump method against the mounting board so that the bumps and the electrodes of the mounting board are in close contact.

The above mounting method is explained below with reference to the accompanying figures.

FIG. 1A is a sectional view of a semiconductor device mounted by the above mounting method, while FIG. 1B is a plan view of the same.

To surround the periphery of the electric circuit pattern of a semiconductor chip 10, pad electrodes 11 are formed of for example aluminum or others near the periphery so as to be connected with the electric circuit pattern.

The forming surface of pad electrodes 11 is covered by a not shown surface protection film comprised of for example a silicon nitride film or a polyimide film, leaving openings at places where the pad electrodes 11 are located.

At these openings, bumps 12 are formed of gold or other conductive materials, and are arranged in a square shape.

In this way a peripheral pad semiconductor device 1 is formed.

FIG. 2A is a side view showing the process of mounting of the above semiconductor device 1, while FIG. 2B is a plan view of the core of the same, In the mounting board 2 on which the semiconductor device 1 is mounted, at the places corresponding to the forming positions of bumps 12 of the semiconductor device 1 that is to be mounted on the upper surface of the board 20 comprised of for example a ceramic-based material, lands 21 (electrode) are formed by means of covering nickel and gold or other platings on pieces of conductive layers comprised of for example copper or others. Not shown printed wires are provided which are connected to the lands 21 and are formed on the front or back surface, or both of the front and back surfaces of the board 20.

To mount the semiconductor device 1, the lands 21 of the mounting board 2 are aligned with the bumps 12 of the semiconductor device 1 and the semiconductor device 1 is placed on the mounting board 2. Onto the upper surface of the semiconductor device 1, a pressure P is imposed through the surface of the projection 3a (bonding tool) of the horn 3. Under the condition that bumps 12 and lands 21 are in close contact, ultrasonic vibration in the $D_V$ direction is generated by a vibrator connected to the horn 3. At this time, ultrasonic vibration is imposed by the horn 3 on the places in close contact between bumps 12 and lands 21, while the amplitude thereof is increased by the horn 3.

Here, the direction $D_v$ of ultrasonic vibration is perpendicular to or parallel with the arrangement direction of the bumps 12.

As for the ultrasonic application apparatus, besides the single support type as shown in FIG. 2A, use may also be made of a double support type apparatus as disclosed in Japanese Patent Publication No. 2915350 or Japanese Unexamined Patent Publication (Kokai) No. 11-45912.

In the above description, the horn 3 is preheated for example to 100° C., furthermore, as a result of application of ultrasonic vibration, frictional heat is produced at the places in close contact between bumps 12 and lands 21.

In the case that the bumps 12 are formed of gold, and the surfaces of the lands 21 are plated with gold, although a temperature of 209° C. or higher is needed to form a bump bonding by metallic bonding between the bumps 12 and the lands 21, as a result of the frictional heat, the temperature at the places in close contact between bumps 12 and lands 21 exceeds the temperature for metallic bonding, so the bumps 12 and lands 21 are able to be connected mechanically and electrically.

In this way, an electric circuit device as shown in FIG. 3 is able to be fabricated in which the semiconductor device 1 is mounted on the mounting board 2.

The electric circuit device with the semiconductor device 1 mounted on the mounting board 2, for example, is sealed for use with resin between the semiconductor device 1 and the mounting board 2.

In the above method of forming bump bonding and mounting by applying ultrasonic vibration, the bump bonding strength can be raised by increasing the amplitude of ultrasonic vibration, increasing the pressure imposed on the semiconductor device, or lengthening the time of application of ultrasonic vibration, and other methods.

However, when the amplitude of ultrasonic vibration is increased, the pressure imposed on the semiconductor device is increased, or the application time of ultrasonic vibration is lengthened to raise the bump bonding strength as described above, there is a danger that crack may occur at the bonding portion of a bump bonding.

Specifically, as shown in FIG. 4, the crack K which takes place at the pad electrodes 11 formed of aluminum or others on the semiconductor chip 10 is called cratering.

Therefore, it is required to adjust the strength of ultrasonic vibration to ensure the bump bonding strength while not causing the cratering or other mechanical damages.

In the related art, however, in semiconductor devices with a number of bumps arranged in any shape, there was a disadvantage that not all bumps can be bonded under the condition that the bonding strength is higher than a desired value and serious mechanical damages do not occur For example, in the semiconductor chip shown in FIG. 1B, in which bumps 12 are arranged in a line forming a rectangle in the peripheral area of the semiconductor chip, when the direction of ultrasonic vibration is made the same as any side of the rectangle, if the bonding condition is optimized so that the bonding strength of all bumps is higher than a specific value, cratering occurs easily at bumps arranged along the sides perpendicular to the application direction of ultrasonic vibration, especially those bumps at the corners of the rectangle.

On the contrary, if the bonding conditions are controlled so that cratering does not occur for all bumps, sufficient bonding strength cannot be attained for bumps arranged along the sides parallel with the application direction of ultrasonic vibration.

This phenomenon becomes conspicuous especially when boards made of glass-epoxy-based or other materials having low hardness are used as the mounting boards

SUMMARY OF THE INVENTION

The present invention is made in consideration of the above disadvantages. Concerning mounting a semiconductor device including a number of bumps arranged in any shape on a mounting board by the ultrasonic bonding, an object of the present invention is to provide a method for fabricating an electric circuit device able to ensure the bonding strength and bond the bumps without occurrence of cratering or other mechanical damages at the locations of all pads in electric connection, and to provide a semiconductor device concerned with the method, and an electric circuit device obtained with the method.

To achieve the above object, according to a first aspect of the present invention, there is provided a method for fabricating an electric circuit device wherein a semiconductor device having a plurality of bumps formed in an approximate polygonal shape or in a straight line arrangement is mounted on a mounting board having electrodes, comprising steps of aligning the bumps with the electrodes and placing the semiconductor device on the mounting board, and while making the bumps and the electrodes contact closely, applying ultrasonic vibration to the semiconductor device in a direction not parallel with any side of the approximate polygon formed by the arranged bumps, or in a direction not parallel with the straight line formed by the arranged bumps.

In the method for fabricating an electric circuit device according to the present invention, preferably, the application direction of ultrasonic vibration on the semiconductor device is such a direction that the dragging force acting on each bump is uniformed during application of ultrasonic vibration, for example, is such a direction that the distance between two bumps along the application direction of ultrasonic vibration is longer than the minimum distance between two bumps.

Furthermore, in the method for fabricating an electric circuit device according to the present invention, preferably, the bumps are arranged in an approximate rectangle on the semiconductor device, and the application direction of ultrasonic vibration on the semiconductor device is the direction of a diagonal of the semiconductor device.

In addition, in the method for fabricating an electric circuit device according to the present invention, preferably, twisted vibration is used as the method of applying ultrasonic vibration to the semiconductor device in a direction not parallel with any side of the approximate polygon formed by the arranged bumps, or in a direction not parallel with the straight line formed by the arranged bumps. Furthermore, preferably, complex vibration including vibration in the normal direction of the mounting board superposed on the twisted vibration is used as the method of applying ultrasonic vibration to the semiconductor device In addition, to achieve the above object, according to a second aspect of the present invention, there is provided a method for fabricating an electric circuit device in which a semiconductor device having a plurality of bumps formed in an approximate polygonal shape on a semiconductor chip so as to be connected with the circuit pattern of the semiconductor chip is mounted on a mounting board having electrodes, comprising steps of aligning the bumps with the electrodes and placing the semiconductor device on the mounting board, and applying ultrasonic vibration to the semiconductor device while making the bumps and the electrodes contact closely, wherein the bumps at the corners or close to the corners of the approximate polygon formed by the arranged bumps are used as dummy bumps only for mechanical connection.

In addition, to achieve the above object, according to a third aspect of the present invention, there is provided a method for fabricating an electric circuit device in which a semiconductor device having a plurality of bumps formed in an approximate polygonal shape on a semiconductor chip so as to be connected with the circuit pattern of the semiconductor chip is mounted on a mounting board having electrodes, comprising steps of aligning the bumps with the electrodes and placing the semiconductor device on the mounting board, and while making the bumps and the electrodes contact closely, applying ultrasonic vibration to the semiconductor device in a plurality of separate steps in a direction at each step perpendicular to each side of the approximate polygon formed by the arranged bumps.

In addition, to achieve the above object, according to a fourth aspect of the present invention, there is provided a semiconductor device having a plurality of bumps formed in an approximate polygonal shape for electric and mechanical connection with the electrodes on a board, wherein the bumps at the corners or close to the corners of the approximate polygon formed by the arranged bumps are used as dummy bumps only for mechanical connection, In addition, to achieve the above object, according to a fifth aspect of the present invention, there is provided an electric circuit device in which a semiconductor device having a plurality of bumps formed in an approximate polygonal shape is mounted on a mounting board having a plurality of electrodes in electric and mechanical connection with the bumps of the semiconductor device, and the bumps at the corners or close to the corners of the approximate polygon formed by the arranged bumps are used as dummy bumps only for mechanical connection.

BRIEF DESCRIPTION OF THE DRAWINGS

These and other objects and features of the present invention will become clearer from the following description of the preferred embodiments given with reference to the accompanying drawings, in which:

FIG. 1A is a sectional view of a semiconductor device to be mounted according to the first and second embodiments, and in the related art, while

FIG. 2A is a side view showing the process of mounting a semiconductor device in the related art, while

FIG. 5A is the side view showing the process of mounting a semiconductor device according to the first embodiment, while

FIG. 7A is a sectional view of an electric circuit device fabricated according to the first and the second embodiments, while

FIG. 9A is a schematic view showing a bump arrangement pattern in which bumps are arranged along the line of a single fold rectangle in the peripheral portion of a semiconductor chip, while FIG. 9B is an enlarged view of the portion C; FIG. 9C is a schematic view showing a bump arrangement pattern in which bumps are arranged along the lines of a multi-fold rectangle in the peripheral portion of a semiconductor chip, while FIG. 9D is an enlarged view of the portion C; FIG. 9E is a schematic view showing a bump arrangement pattern in which bumps are arranged along the lines of two single fold rectangles in the peripheral portion and in the central portion of a semiconductor chip, respectively, while FIG. 9F is an enlarged view of the portion C;

FIG. 10A is a schematic view showing a bump arrangement pattern in which bumps are arranged in the entire area of a semiconductor chip, while

FIG. 11A is a schematic view showing an approximate rectangular bump arrangement pattern in which some bumps are removed from the bump arrangement pattern of a single fold rectangle in the peripheral portion of a semiconductor chip, while

FIG. 12A is a schematic view of a square bump arrangement, and FIG. 12B is a setting of the direction of ultrasonic vibration applicable to FIG. 12A; FIG. 12C is a schematic view of a triangular bump arrangement.

FIG. 13A shows a square bump arrangement, and FIG. 13B shows an octagonal bump arrangement;

FIG. 14A is a schematic view of a bump arrangement at a corner of the polygon formed by the arranged bumps when a semiconductor device including bumps arranged in a polygonal shape on a semiconductor chip is mounted on a mounting board by means of the ultrasonic bonding of the related art, while

FIG. 15A is a schematic view of a bump arrangement at a corner of the polygon formed by the arranged bumps when a semiconductor device including bumps arranged in a polygonal shape on a semiconductor chip is mounted on a mounting board by means of the ultrasonic bonding of the present invention, while

FIG. 16A is a schematic view showing tho bump arrangement, FIG. 16B is a sectional view along the A–A' line of FIG. 16A.

FIG. 18A is a schematic view showing bumps at corners or close to corners of the approximate polygon formed by the arranged bumps are used as dummy bumps, while.

FIG. 21A is an enlarged side view of the portion of a semiconductor chip when twisted vibration is applied, while

DESCRIPTION OF THE PREFERRED EMBODIMENTS

Below, preferred embodiments of a method for fabricating an electronic circuit device, a semiconductor device concerned with the method, and an electric circuit device obtained with the method according to the present invention will be described with reference to the accompanying drawings.

First Embodiment

Figure 1A:
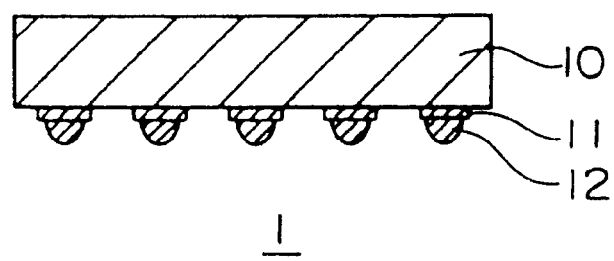
Figure 1B:
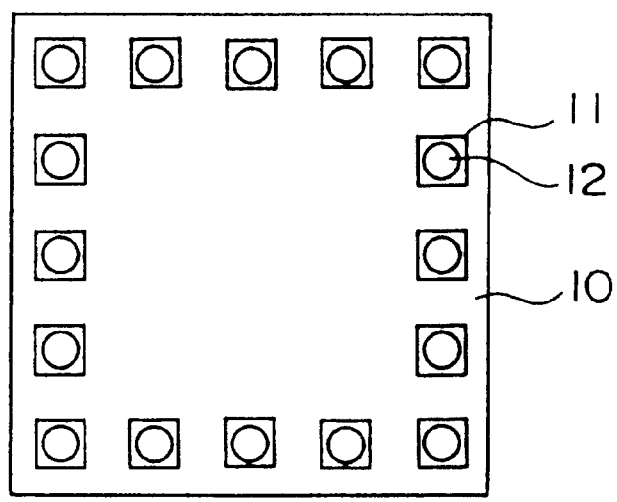
FIG. 1B is the plan view of the same.
Figure 2A:
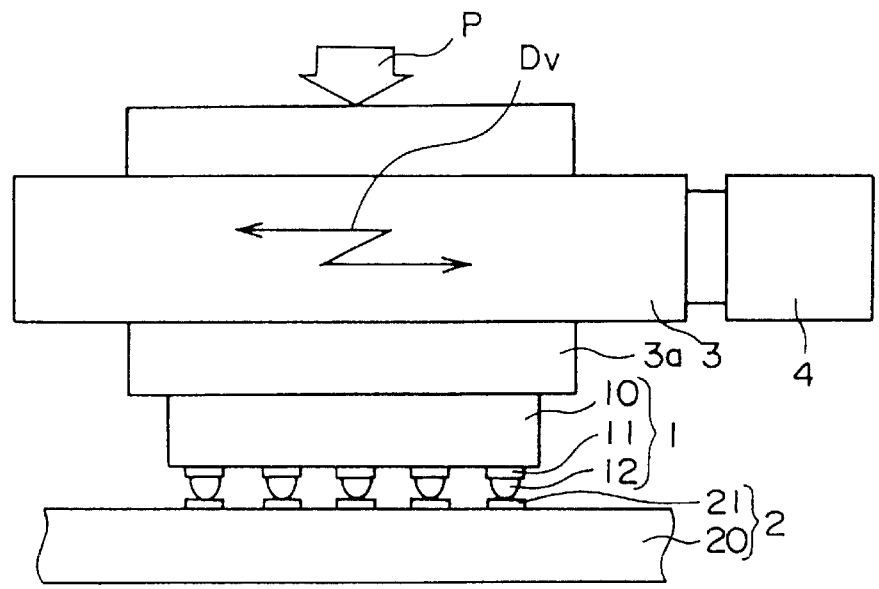
Figure 2B:
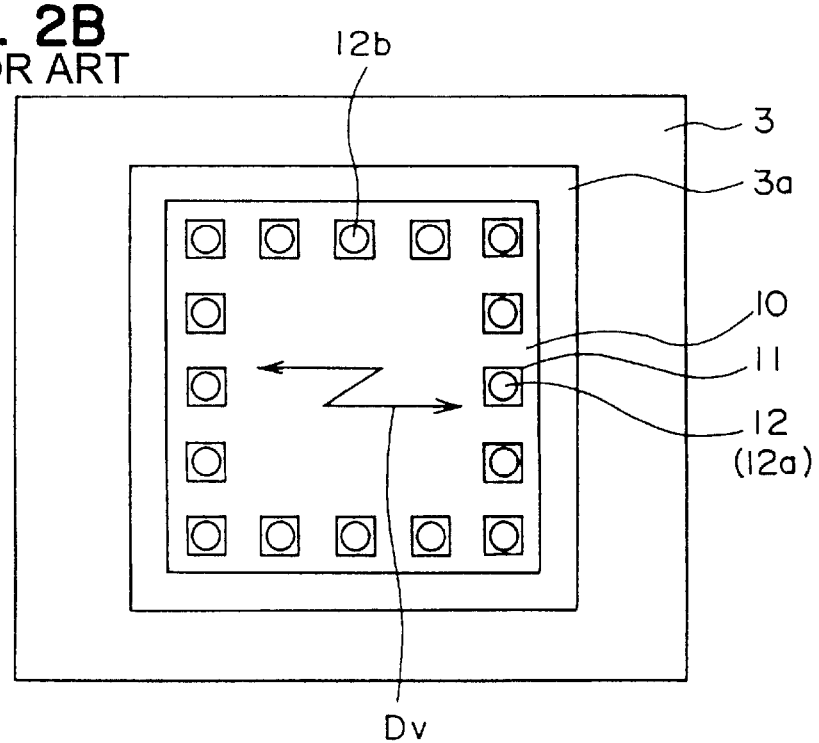
FIG. 2B is the plan view of the core of the same.
Figure 3:
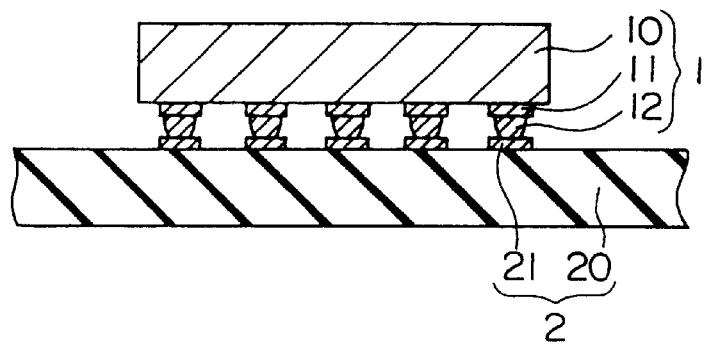
FIG. 3 is a sectional view of an electric circuit device fabricated in the related art.
Figure 4:
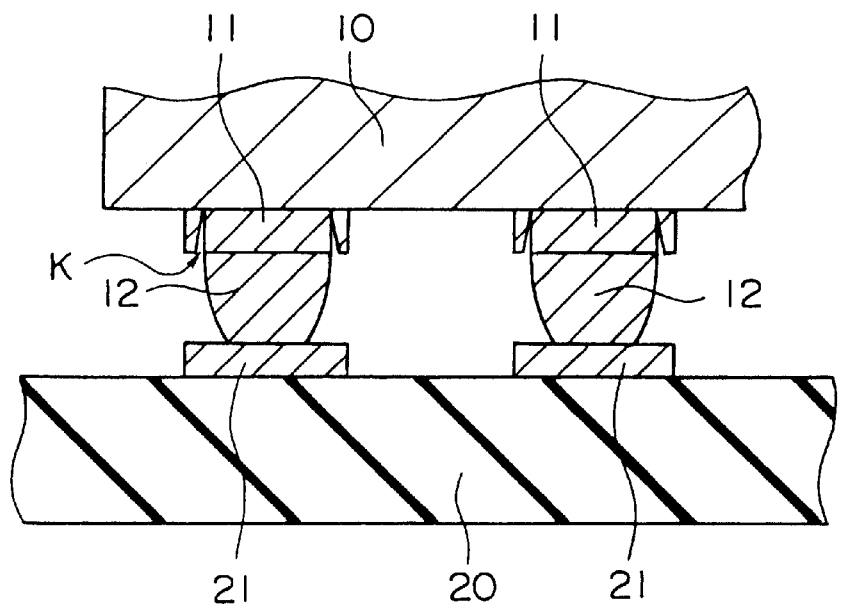
FIG. 4 is a sectional view for explaining the disadvantages in the related art.

FIG. 1A is a sectional view of a semiconductor device to be mounted according to the first embodiment, while FIG. 1B is the plan view of the same.

To surround the periphery of the electric circuit pattern of a semiconductor chip 10 having for example an area of 3 mm×3 mm and a thickness of 0.3 mm, pad electrodes 11 are formed of for example aluminum or others near the periphery so as to be connected with the electric circuit pattern.

The forming surface of the pad electrodes 11 is covered by a not shown surface protection film comprised of for example a silicon nitride film or a polyimide film, leaving openings at places where the pad electrodes 11 are located.

At these openings, bumps 12 are formed of gold or other conductive materials, and are arranged in square shapes as the arrangements in FIG. 9A. For example, in case of gold stud bump (gold 99.99%), bumps that are 70 to 80 $\mu$m in diameter and about 50 $\mu$m in height can be formed using gold wires by means of wire bonding. The number of bumps of one semiconductor chip is for example 75.

Figure 5A:
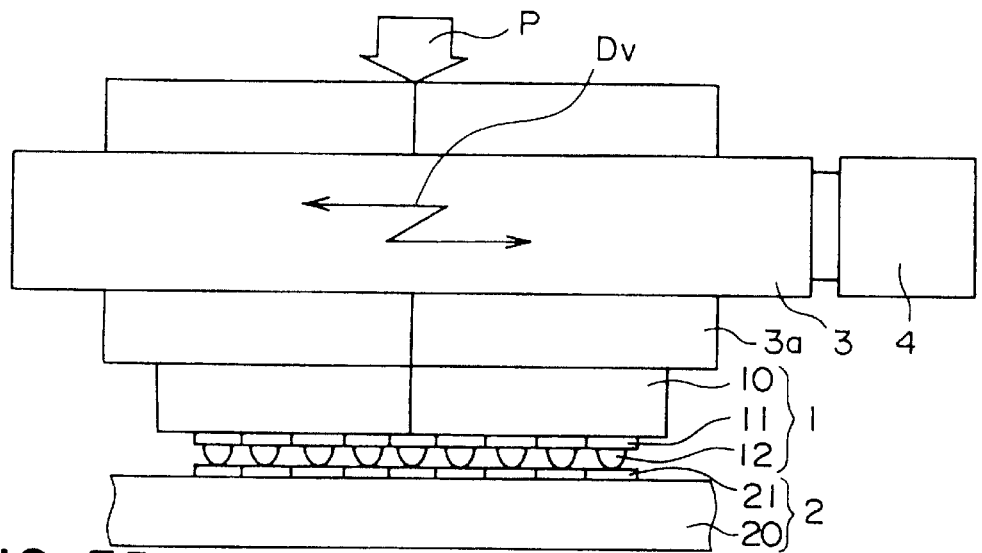
Figure 5B:
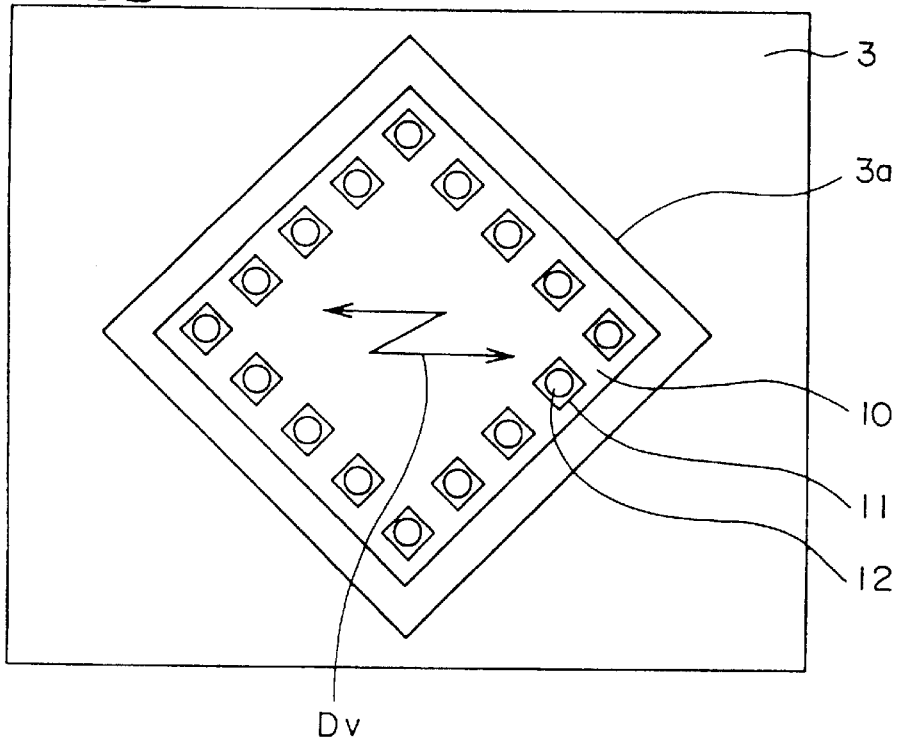
FIG. 5B is a plan view of the core of the same.

In this way, a peripheral pad semiconductor device 1 is formed,

FIG. 5A is the side view showing the process of mounting the semiconductor device 1, while FIG. 5B is a plan view of the core of the same.

In the mounting board 2 on which the semiconductor device 1 is mounted, and at the places corresponding to the forming positions of bumps 12 of the semiconductor device 1 that is to be mounted on the upper surface of the board 20 comprised of for example a glass-epoxy-based material or a ceramic-based material, lands 21 (electrode) each being for example about 50 $\mu$m in width are formed by means of covering nickel and gold or other platings on pieces of conductive layers comprised of for example copper or others. Not shown printed wires are provided which are connected to the lands 21 and are formed on the front or back surface, or both of the front and back surfaces of the board 20.

To mount the semiconductor device 1, first, the lands 21 of the mounting board 2 are aligned with the bumps 12 of the semiconductor 1 and the device is placed on the board.

The projection 3a (bonding tool) of the horn 3 comprises a not shown mechanism for absorbing the semiconductor device 1 by sucking. The semiconductor device 1 is absorbed and placed on the mounting board 2 with the direction of ultrasonic vibration to be a direction of a diagonal of the semiconductor chip or a direction not parallel with any side of the square formed by the arranged bumps. The projection 3a of the horn 3 is formed being turned by a specified angle matching the angle at which the semiconductor 1 is absorbed.

Figure 6A:
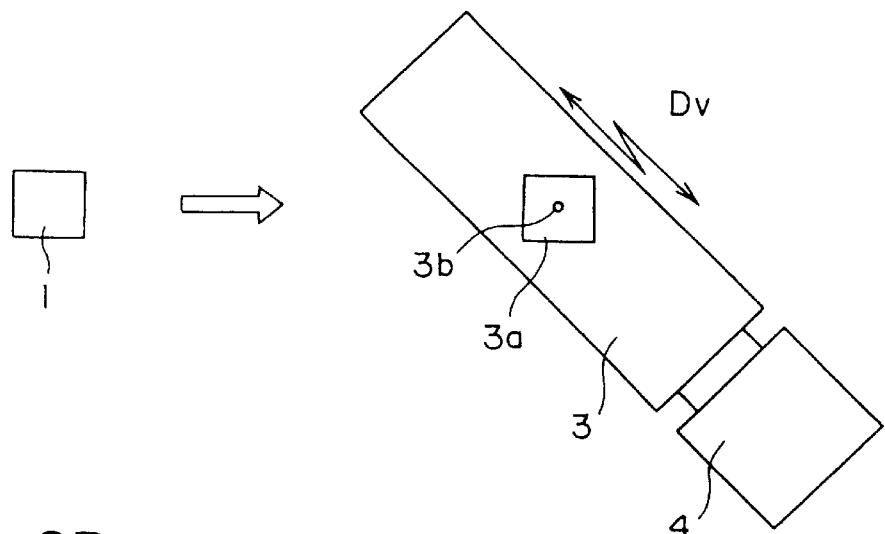
FIG. 6 is a schematic view explaining the method according to the first embodiment for attracting and absorbing a semiconductor device so that the direction of ultrasonic vibration and the bump arrangement direction form a specific angle.
Figure 6B:
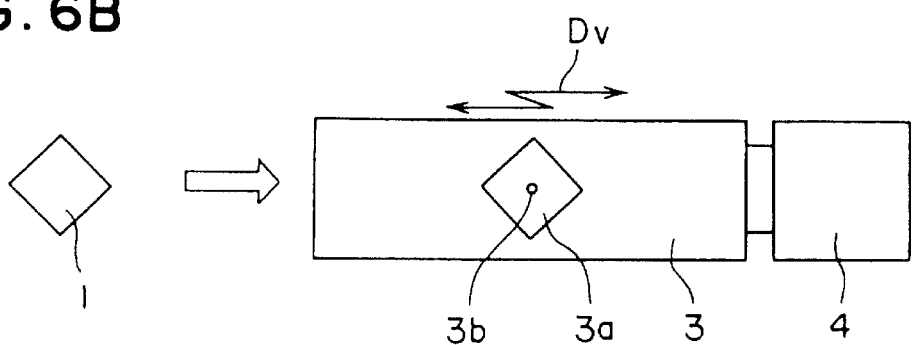

In order for the projection 3a of the horn 3 to attract and absorb the semiconductor device 1 in a direction along a diagonal of the semiconductor chip, or a direction not parallel with any side of the square formed by the arranged bumps, for example as shown in FIG. 6A, the horn 3 having the projection 3a and the sucking hole 3b may be tilted in advance by a specific angle, while the semiconductor device 1 is transported without being tilted, alternatively, as shown in FIG. 6B, the horn 3 having the projection 3a and the sucking hole 3b is not tilted, but the semiconductor device 1 is tilted in advance by a specific angle and is transported.

Next, onto the upper surface of the semiconductor device 1, a pressure P is imposed through the surface of the projection 3a of the horn 3. Under the condition that bumps 12 and lands 21 are in close contact, ultrasonic vibration in the $D_v$ direction is generated by a vibrator 4 connected to the horn 3. At this time, while increasing the amplitude of ultrasonic vibration by the horn 3, ultrasonic vibration is applied by the horn 3 on the places in close contact between bumps 12 and lands 21.

The pressure imposed by the horn 3 is, for example about 8 kgf, the applied ultrasonic vibration is, for example, 10 W in output, 50 kHz in frequency, 2 $\mu$m in amplitude, and 0.3 to 0.4 seconds in oscillation time.

The horn 3 is preheated for example to 100° C., furthermore, frictional heat is produced at the places in close contact between bumps 12 and lands 21 as a result of application of ultrasonic vibration.

In the case that the bumps 12 are formed of gold, and the surfaces of the lands 21 are plated with gold, a temperature of 209° C. or higher is needed to form a bump bonding by metallic bonding between the bumps 12 and the lands 21. As a result of the frictional heat, the temperature at the places in close contact between bumps 12 and lands 21 is higher than the temperature for metallic bonding, so the bumps 12 and lands 21 are able to be connected mechanically and electrically.

Figure 7A:
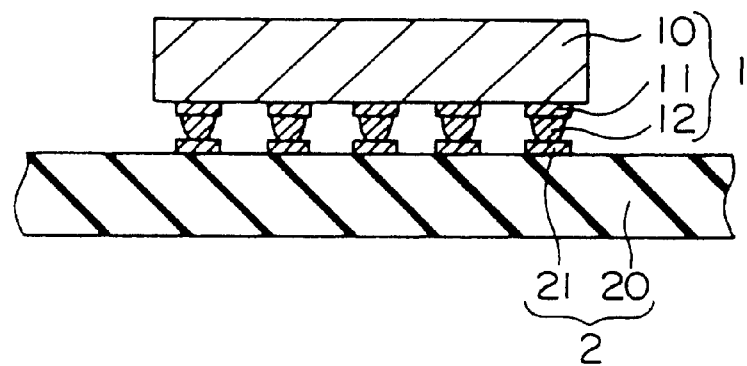
Figure 7B:
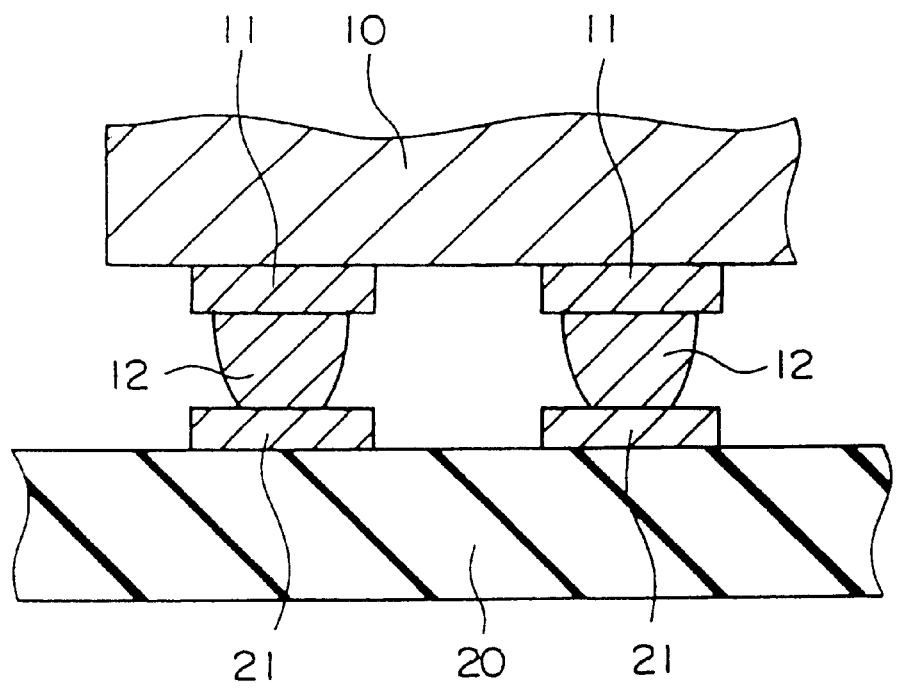
FIG. 7B is an enlarged view of the core of the same.

In this way, an electric circuit device is able to be fabricated in which the semiconductor device 1 is mounted on the mounting board 2, as shown in the sectional view of FIG. 7A and the enlarged view of FIG. 7B of the core of the FIG. 7A.

Table 1 summarizes the experimental results on the bump-land bonding strength and occurrence of cratering when mounting under the above bonding conditions, and the experimental conditions of ultrasonic bonding experiments.

TABLE 1

ULTRASONIC BONDING EXPERIMENT

| | EXPERIMENTAL CONDITIONS | | | | EXPERIMENTAL RESULTS | |
|---|---|---|---|---|---|---|
| SAMPLE No. | ULTRASONIC APPLICATION DIRECTION | PRESSURE | AMPLITUDE | OSCILLATION TIME | BUMP-LAND BONDING STRENGTH | CRATERING |
| 1 | DIAGONAL DIRECTION (PRESENT INVENTION) | 8 kgf | 2 μm | 0.3 SECONDS | ACCEPTABLE | NOT OCCURRED* |
| 2 | DIRECTION OF SIDE (RELATED ART) | 8 kgf | 2 μm | 0.3 SECONDS | GOOD | OCCURRED SOMEWHERE |
| 3 | DIAGONAL DIRECTION (PRESENT INVENTION) | 8 kqf | 2 μm | 0.4 SECONDS | ACCEPTABLE | NOT OCCURRED* |
| 4 | DIRECTION OF SIDE (RELATED ART) | 8 kgf | 2 μm | 0.4 SECONDS | GOOD | OCCURRED SOMEWHERE |

*OCCURRED FOR BUMPS ON SIDES PERPENDICULAR WITH THE APPLICATION DIRECTION OF THE ULTRASONIC VIBRATION

Figure 8:
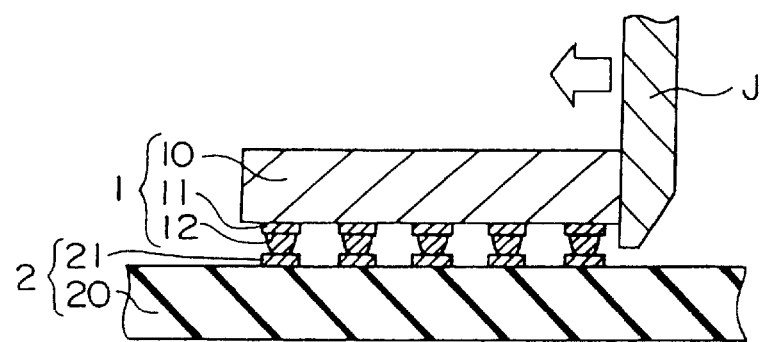
FIG. 8 is a sectional view showing a method for determining the die shear strength.

Here, the bump-land bonding strength, as shown in FIG. 8, is obtained from measurements of the die shear strength, which is measured by fixing the electric circuit device having the semiconductor device 1 mounted on the mounting board 2, imposing a force at one end of the semiconductor device (chip) 1 and in parallel with the mounting board 2, and measuring the strength using a probe J for die shear strength measurement when the semiconductor device (chip) 1 is stripped.

In addition, cratering is inspected by observing the back surface of the pad electrodes 11 comprised of aluminum or others, through silicon, the parent material of the semiconductor chip, using an infrared microscope.

As shown in Table 1, if the application direction of ultrasonic vibration was parallel with a side of the square formed by the arranged bumps (cases of the related art), although the bump-land bonding strength was excellent, cratering took place at bumps along the side perpendicular to the application direction of ultrasonic vibration.

On the other hand, if the application direction of ultrasonic vibration was along a diagonal of the square formed by the arranged bumps (the present invention), sufficient bump-land bonding strength was attained, and cratering did not take place.

According to the above method for fabricating an electric circuit device, by applying ultrasonic vibration in a direction along a diagonal of the semiconductor chip, or a direction not parallel with any side of the square formed by the arranged bumps, it is able to be achieved to ensure necessary bonding strength, increase reliability and bond bumps without occurrence of cratering or other mechanical damages at places of all pads in electric connection.

In the above embodiment, an application to a bump arrangement pattern in a square shape is taken as an example and explained, but the present invention is also applicable to bump arrangement patterns in other various shapes. FIGS. 9A to 9F, FIGS. 10A to 10C and FIGS. 11A and 11B are the schematic views showing applicable bump arrangement patterns. Below they will be explained in detail.

FIG. 9A and the enlarged view FIG. 9B of portion C of FIG. 9A show a bump arrangement pattern in which bumps 12 are arranged along the line of a single fold rectangle in the peripheral portion of a semiconductor chip and form a bump arrangement direction $D_B$. FIG. 9C and the enlarged view FIG. 9D of portion C of FIG. 9C show a bump arrangement pattern in which bumps 12 are arranged along the lines of a multi-fold rectangle (for example 3 folds) in the peripheral portion of a semiconductor chip and form a bump arrangement direction $D_B$. FIG. 9E and the enlarged view FIG. 9F of portion C in FIG. 9E show a bump arrangement pattern in which bumps 12 are arranged along the lines of two single fold rectangles in the peripheral portion and in the central portion of a semiconductor chip, respectively, and form a bump arrangement direction $D_B$.

Figure 10A:
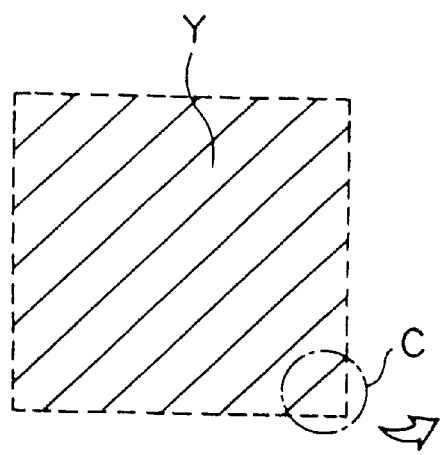
Figure 10B:
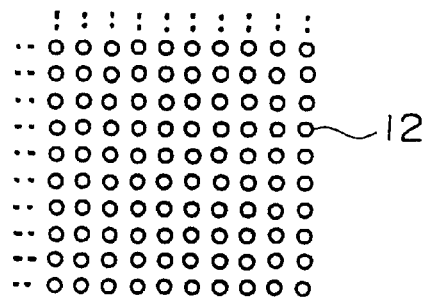
FIG. 10B is an enlarged view of the portion C.
Figure 10C:
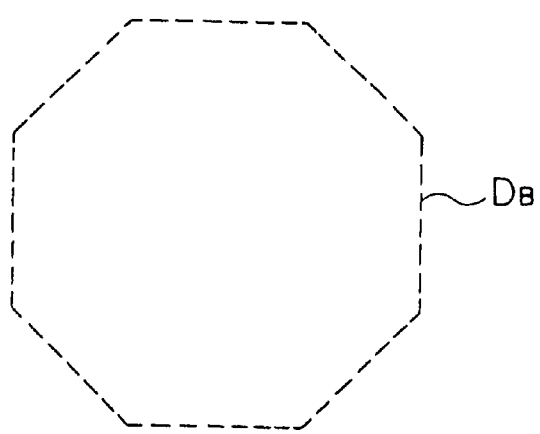
FIG. 10C is a schematic view showing a bump arrangement pattern in which bumps are arranged in an octagonal shape.

In addition, FIG. 10A and the enlarged view FIG. 10B of portion C in FIG. 10A show a bump arrangement pattern in which bumps 12 are arranged in the entire area Y of a semiconductor chip. FIG. 10C shows a bump arrangement pattern in which bumps 12 are arranged in a polygonal shape (for example an octagon) and form a bump arrangement direction $D_B$.

Figure 11A:
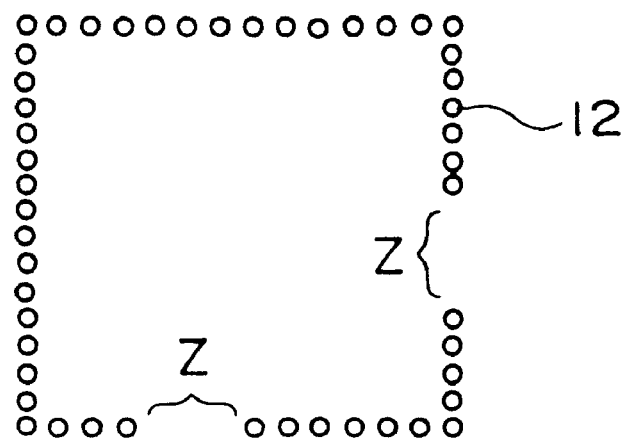
Figure 11B:
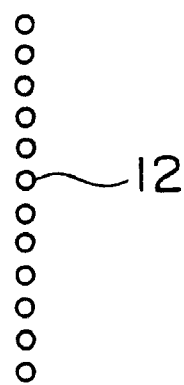
FIG. 11B is a schematic view showing a bump arrangement pattern in which bumps are arranged along a straight line.

In addition, FIG. 11A shows an approximate rectangular bump arrangement pattern in which some bumps Z are removed from the bump arrangement pattern of a single fold rectangle in the peripheral portion of a semiconductor chip. FIG. 11B shows a bump arrangement pattern in which bumps 12 are arranged along a straight line.

When mounting semiconductor chips having above bump arrangement patterns, the application direction of ultrasonic vibration is not parallel with any side of the approximate polygon formed by the arranged bumps, or in a direction not parallel with the straight line formed by the arranged bumps.

When bumps are arranged in an approximate polygonal shape, as the direction not parallel with any side of the approximate polygon, the angle between a side of the approximate polygon and the application direction of ultrasonic vibration can be set to be for example 20 degrees, 40 degrees, 60 degrees or 80 degrees.

The same setting is usable when bumps are arranged in a straight line.

Figure 12A:
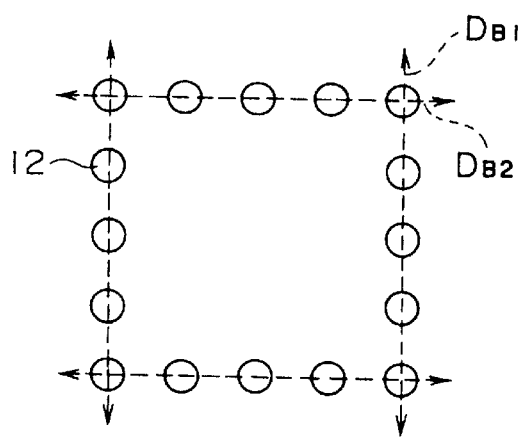
FIGS. 12A to 12C are schematic views showing examples of the directions of ultrasonic vibration applied on the bumps arranged in polygonal shapes.
Figure 12B:
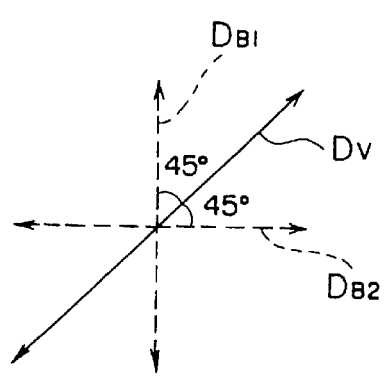

For example, as shown in FIG. 12A, when bumps are arranged in a square shape on a semiconductor chip, as shown in FIG. 12B, the direction of ultrasonic vibration $D_v$ can be set to be different from the directions (bump arrangement directions $D_{B1}$ and $D_{B2}$) of sides of the square formed by the arranged bumps, for example directions intersecting the bump arrangement directions $D_{B1}$ and $D_{B2}$ at 45 degrees, respectively.

Figure 12C:
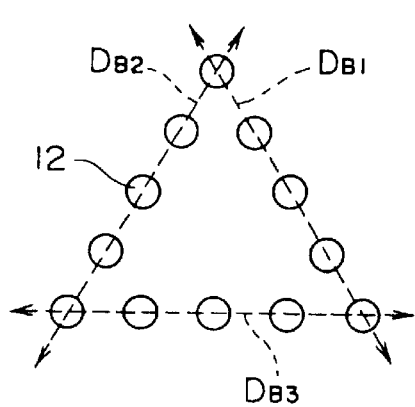
Figure 12D:
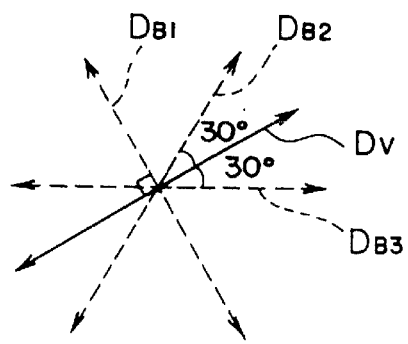
FIG. 12D is a setting of the direction of ultrasonic vibration applicable to FIG. 12C.

In addition, for example, as shown in FIG. 12C, when bumps are arranged in a regular triangular shape, as shown in FIG. 12D, the direction of ultrasonic vibration $D_V$ can be set to be different from the directions (bump arrangement directions $D_{B1}$, $D_{B2}$ and $D_{B3}$) of each sides of the regular triangle formed by the arranged bumps, for example directions intersecting the bump arrangement directions $D_{B2}$ and $D_{B3}$ at 30 degrees, respectively, and perpendicular to the bump arrangement directions $D_{B1}$.

When mounting semiconductor chips having the above bump arrangement patterns, ultrasonic vibration may be applied to the semiconductor device in a number of separate steps in a direction at each step perpendicular to each side of the approximate polygon formed by the arranged bumps.

As a result, since the dragging force acting on each bump is uniformed during application of ultrasonic vibration, even when boards made of glass-epoxy-based or other materials having low hardness are used as the mounting boards, it is able to be achieved to ensure necessary bonding strength without occurrence of cratering or other mechanical damages at places of all pads in electric connection.

Figure 13A:
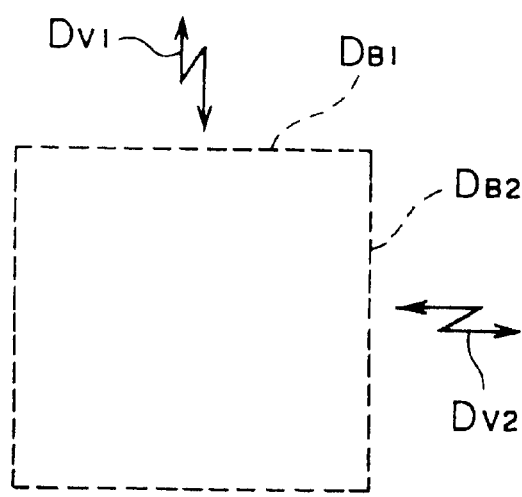
FIGS. 13A and 13B are schematic views showing examples of the directions of ultrasonic vibration when applying ultrasonic vibration to the semiconductor device in a number of separate steps in a direction at each step perpendicular to each side of the approximate polygon formed by the arranged bumps.

For example, as shown in FIG. 13A, when bumps are arranged in a square shape on a semiconductor chip, the directions perpendicular to the directions of the sides of the square formed by the arranged bumps (bump arrangement directions $D_{B1}$ and $D_{B2}$) may be set as the application directions $D_{V1}$ and $D_{V2}$ of ultrasonic vibration, and ultrasonic vibration may be applied on a semiconductor chip in two separate steps each in one direction.

Figure 13B:
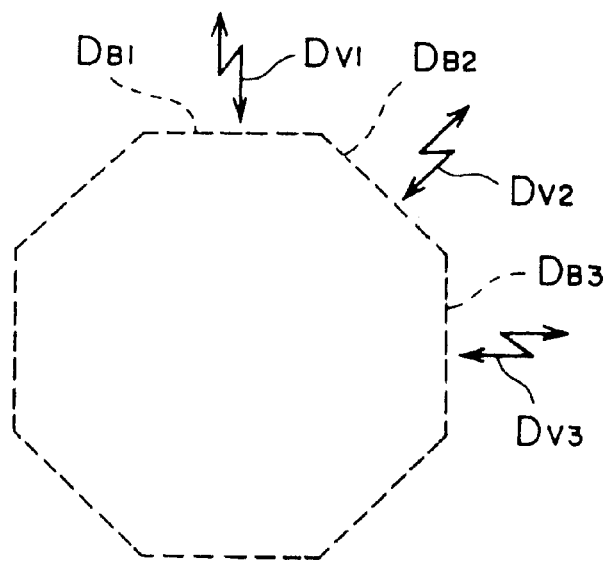

For example, as shown in FIG. 13B, when bumps are arranged in a octagonal shape on a semiconductor chip, the directions perpendicular to the directions of the sides of the octagon formed by the arranged bumps (bump arrangement directions $D_{B1}$, $D_{B2}$ and $D_{B3}$) may be set as the application directions $D_{V1}$, $D_{V2}$ and $D_{V3}$ of ultrasonic vibration, and ultrasonic vibration may be applied on a semiconductor chip in three separate stops each in one direction.

So far, various embodiments of the present invention were explained. Explained below are the mechanisms that cratering and other mechanical damages occur at some locations when arranging a number of bumps in any shape and bonding by the ultrasonic bonding method of the related art, and the mechanisms that such mechanical damages do not happen when using the bonding method of the present invention.

The following two points could be considered as possible mechanisms of the occurrence of cratering and other mechanical damages when using the ultrasonic bonding method of the related art.

Figure 14A:
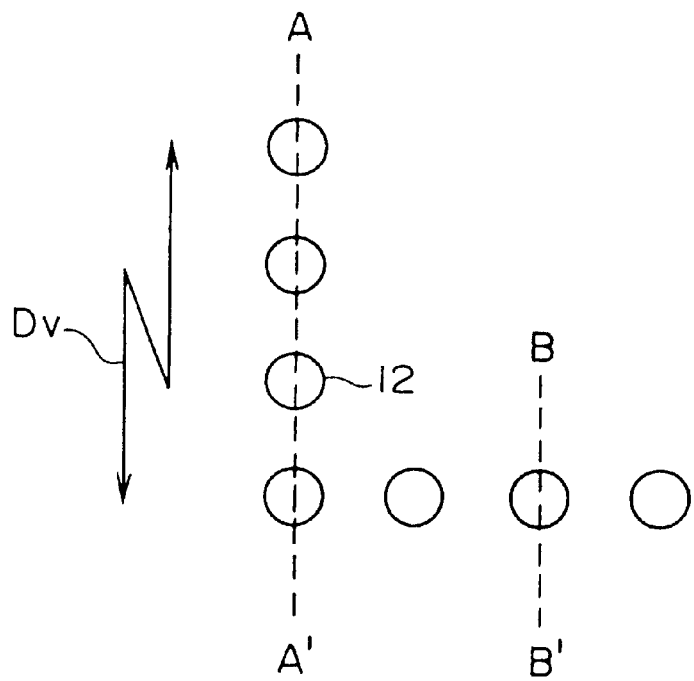

FIG. 14A is a schematic view of a bump arrangement at a corner of a polygon formed by the arranged bumps 12 when a semiconductor device including bumps 12 arranged in a polygonal shape on a semiconductor chip is mounted on a mounting board by means of the ultrasonic bonding.

This semiconductor device has substantially the same configuration as that shown in FIG. 1, and bumps 12 are formed on pads 11 that are formed on the semiconductor chip 10, On the mounting board, lands 21 are formed on the board 20.

Figure 14B:
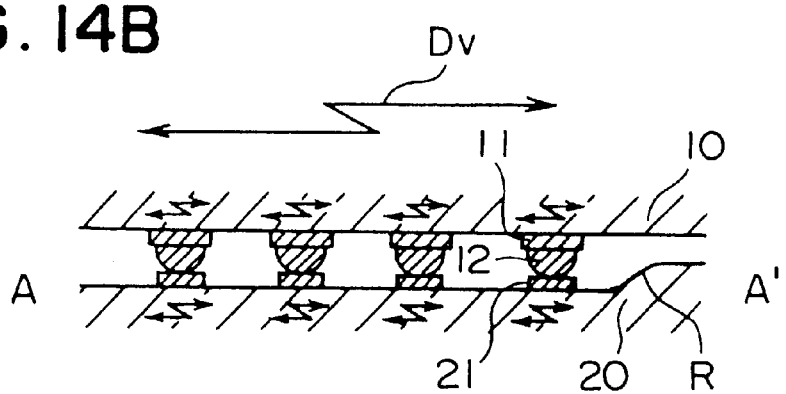
FIG. 14B is a sectional view along the A–A' line of FIG. 14A.

In the A–A' portion, along the application direction $D_v$ of ultrasonic vibration, bumps 12 are arranged in a line. As shown in FIG. 14B, which is a sectional view along the A–A' line of FIG. 14A, because of the application of ultrasonic vibration, vibration takes place near the surface of the mounting board close to the lands 21 and near the surface of the substrate of the semiconductor chip close to the pads 11. Vibration generated in this way is propagated via the mounting board or the substrate of the semiconductor chip, and causes different vibration from that directly applied to the bumps nearby from the ultrasonic horn. The manner of the propagation of the above vibration depends on the hardness of the board.

Figure 14C:
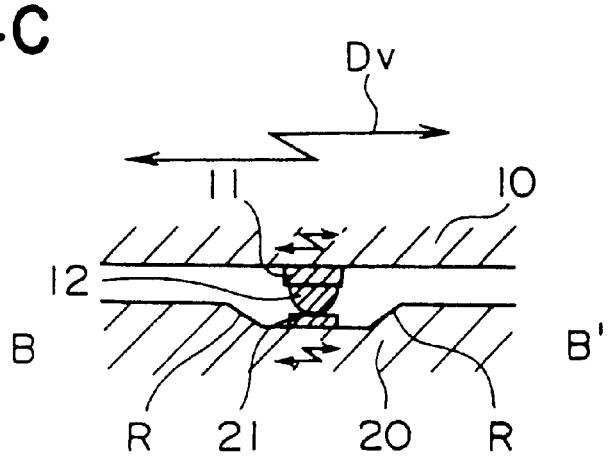
FIG. 14C is a sectional view along the B–B' line of FIG. 14A.

Therefore, in the vibration imposed on the bump-land bonding surface, the above vibration is superposed on that directly applied from the horn, and the frictional force on the bump-land bonding surface turns out to be different from that when a bump 12 alone is arranged along the application direction of ultrasonic vibration, as shown in FIG. 14C, which is a sectional view along the B–B' line of FIG. 14A.

In addition, when bonding with ultrasonic wave, because the board 20 is imposed on by a depressing force, as shown in FIGS. 14B and 14C, the bumps 12 and the lands 21 are in a state of sinking into the board 20. The sinking depth depends on the hardness of the board 20.

As a result, near the bump at the end of a series of bumps arranged in a line, and the bump singly arranged, there appears a slope R on the surface of the board 20 in the application direction of ultrasonic vibration.

In contrast, near the bump not at the end of a series of bumps arranged in a line as shown in FIG. 14B, a slope is not formed on the surface of the board 20, It is believed that the above slopes influence the vibration of bumps when applying ultrasonic vibration, so the frictional force of the bump-land bonding surface is different between bumps arranged in a line and bumps arranged singly.

From the above two possible reasons, since the friction force of the bump-land bonding surface is different between bumps arranged in a line and bumps arranged singly, it is conceivable that if sufficient bump-land bonding strength is secured for a part of bumps, the vibration applied to the other part of bumps becomes too strong that cratering or other mechanical damages happen, alternatively, if the vibration is controlled to some degree so that mechanical damages do not happen to the latter part of bumps, sufficient bump-land bonding strength cannot be obtained to the former part of bumps. Therefore, it is clear that to prevent the occurrence of mechanical damages for all bumps, the frictional force and dragging force acting on each bump should be uniformed.

Next explained are the mechanisms of preventing cratering and other mechanical damages by making uniform the dragging force acting on each bump during the application of ultrasonic vibration in the present embodiment described above.

Figure 15A:
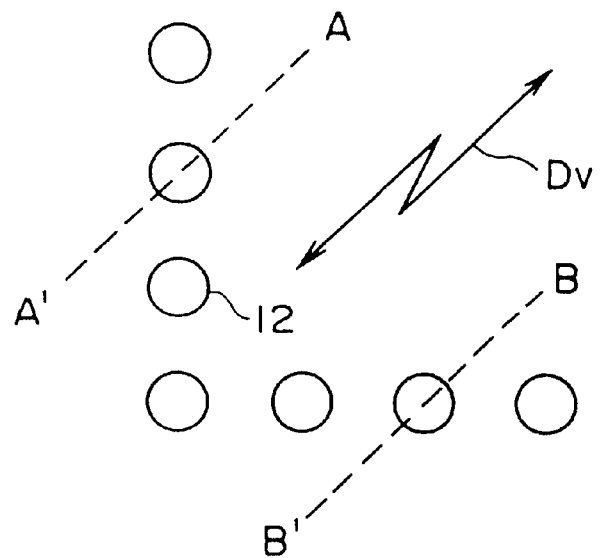

FIG. 15A is a schematic view of a bump arrangement at a corner of a polygon, for example a square, formed by the arranged bumps 12 when a semiconductor device including bumps 12 arranged in a polygonal shape (a square) on a semiconductor chip is mounted on a mounting board by means of ultrasonic bonding. The direction $D_v$ of vibration application is set to be different from any side of the polygon (a square) formed by the arranged bumps 12.

Figure 15B:
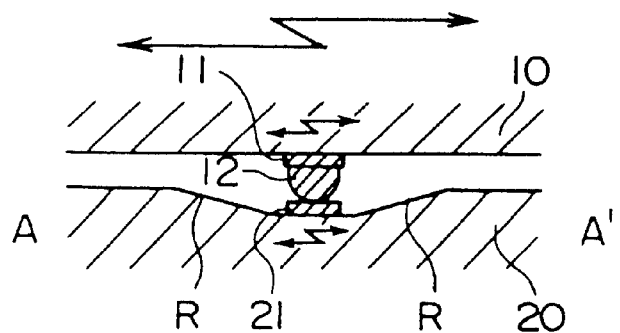
FIG. 15B is a sectional view along the A–A' line of FIG. 15A.
Figure 15C:
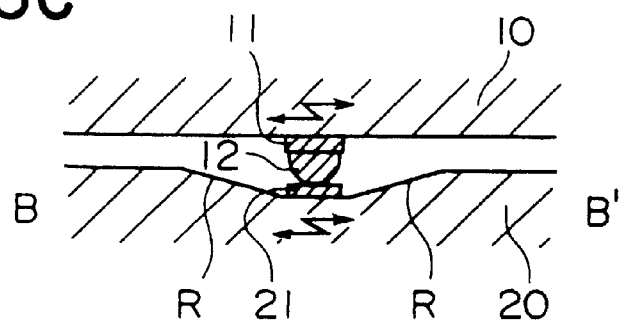
FIG. 15C is a sectional view along the B–B' line of FIG. 15A.

FIG. 15B is a sectional view along the A–A' line of FIG. 15A, and FIG. 15C is a sectional view along the B–B' line of FIG. 15A.

As shown in these figures, relative to the application direction of ultrasonic vibration, each individual bump has the same arrangement condition as those singly arranged, and influences of vibration from bumps nearby are small. Further, as all bump are under the same vibration condition, the difference between bumps arranged in a line and bumps arranged singly disappears.

Figure 16A:
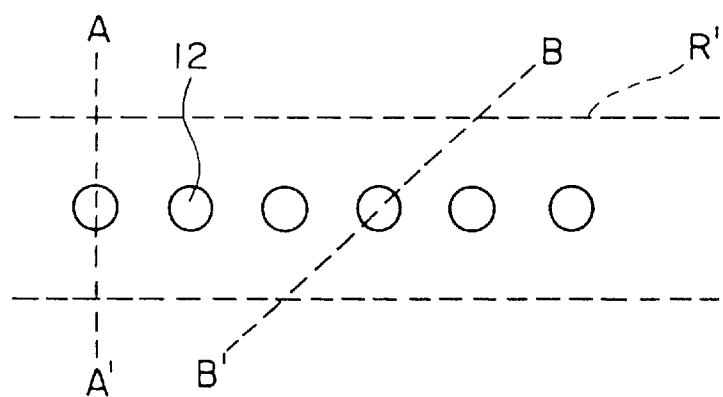
FIGS. 16A and 16B are schematic views for explaining the dragging force acting on each bump being uniformed according to the present invention.
Figure 16B:
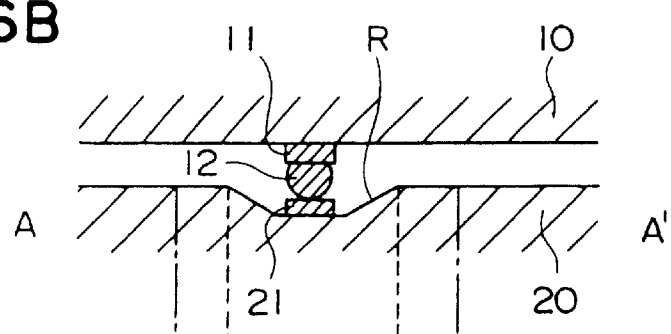
Figure 16C:
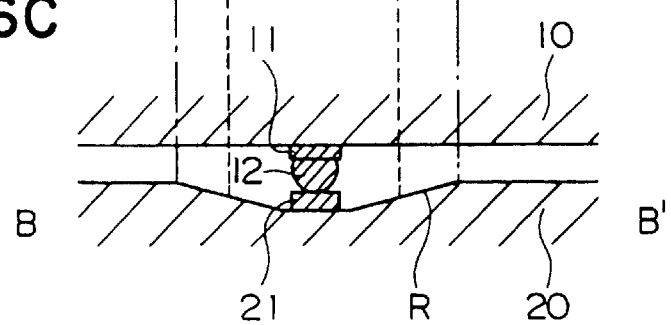
FIG. 16C is a sectional view along the B–B' line of FIG. 16A.

In addition, FIG. 16A is a schematic view of a bump arrangement when a semiconductor device including bumps 12 arranged in a line on a semiconductor chip is mounted on a mounting board by means of ultrasonic bonding. Further, FIG. 16B is a sectional view along the A–A' line of FIG. 16A, and FIG. 16C is a sectional view along the B–B' line of FIG. 16A. The dashed lines R' of FIG. 16A represents the edge of the slopes on the surface of the board 20 in FIG. 16B and FIG. 16C.

As shown in FIG. 16C, in a cross section along a direction inclined with respect to the arrangement direction of the bumps arranged in a line, the slope R formed on the surface of the board 20 is more gentle than in a cross section along a direction perpendicular to the arrangement direction of the bumps arranged in a line. Therefore, during the period of vibration, the influence due to the slopes between the bumps arranged in a line and the bumps arranged singly becomes small.

From the above reasons, in the bump arrangement patterns with bumps formed in the entire chip area as shown in FIG. 10A and FIG. 10B, since bumps in the central area are completely not influenced by the slopes R during application of ultrasonic vibration, this bump arrangement pattern is capable of uniform application of vibration to all the bump-land bonding surfaces, thus the present invention is also effective.

From the above mechanisms during application of ultrasonic vibration, it can be said that the directions not parallel with any side of the approximate polygon formed by the arranged bumps in a semiconductor device is the application direction that makes the dragging force acting on each bump uniform.

Figure 17:
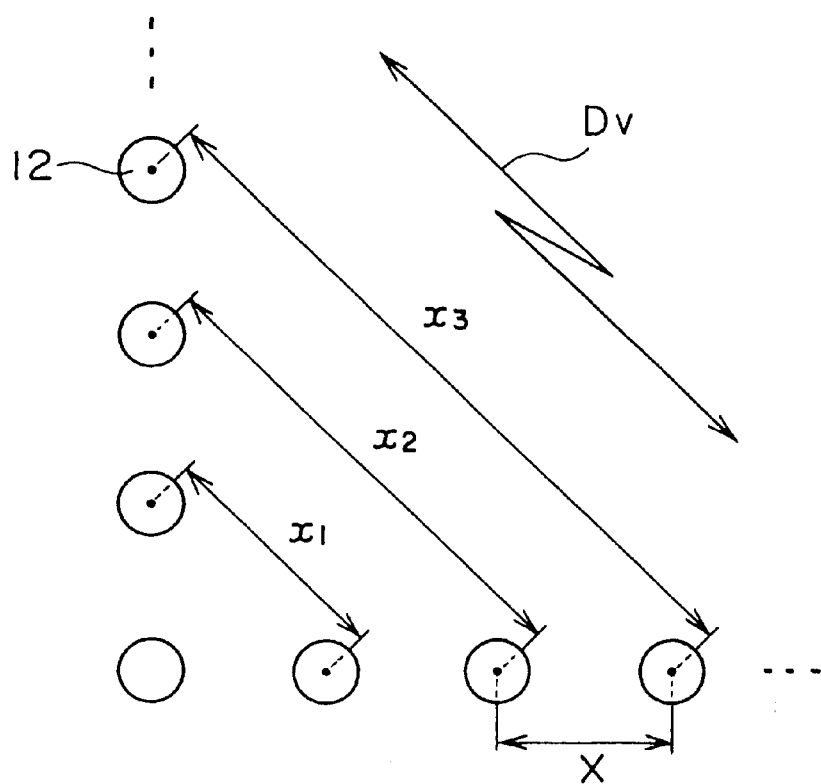
FIG. 17 is a schematic view for explaining the dragging force acting on each bump being uniformed according to the present invention.

In addition, the aforesaid direction making the dragging force acting on each bump uniform, in other words, as shown in FIG. 17, can be said to be the application direction making the distance between two bumps 12 along the application direction $D_v$ of ultrasonic vibration longer than the minimum distance X between two bumps.

In addition, from the above mechanisms during application of ultrasonic vibration, when bonding bumps arranged in an approximate polygonal shape by ultrasonic wave, because bumps at the corners or close to the corners are more susceptible than the other bumps to the slopes formed on the surface of the board, it is clear that cratering and other mechanical damages occur easily at these places.

Figure 18A:
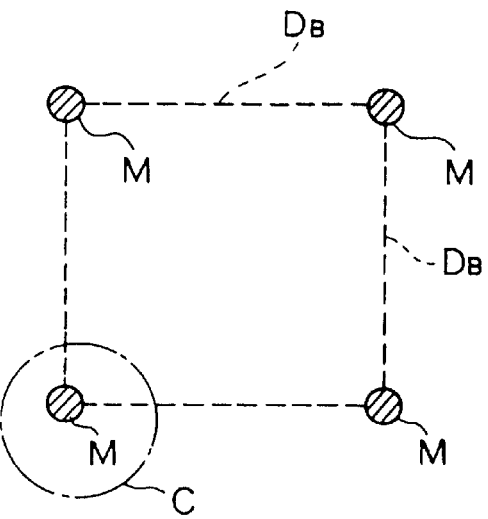

Accordingly, as shown in FIG. 18A, by making the bumps at the corners or close to the corners of the polygon (a square in the figure) formed by the bumps arranged along the bump arrangement direction $D_B$ dummy bumps M that are used only for mechanical connection, because there will not be any influences even cratering occurs at places of those dummy bumps, the bonding condition can be optimized so that the bonding strength of bumps not at corners or not close to corners is set higher than a specific value. Therefore, especially even when boards made of glass-epoxy-based or other materials having low hardness are used as the mounting boards, bump bonding is able to be made ensuring bonding strength and without occurrence of cratering or other mechanical damages at places of all pads in electric connection.

Figure 18B:
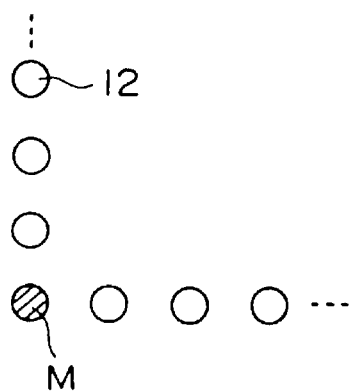
FIG. 18B shows the bump arrangement when the bumps at corners are used as dummy bumps.
Figure 18C:
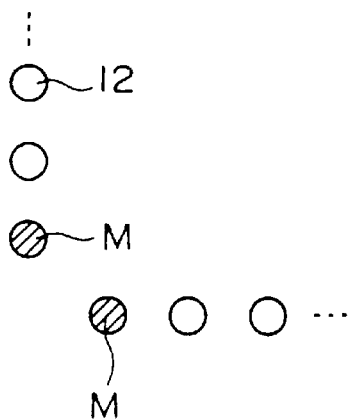
FIG. 18C shows the bump arrangement when the bumps close to corners are used as dummy bumps.

For example, the bumps at the corners of the arrangement of bumps 12 as shown in FIG. 18B, or the bumps close to the corners of the arrangement of bumps 12 as shown in FIG. 18C can be specified as bumps to be made as dummy bumps.

According to the above method for fabricating an electric circuit device when bonding bumps by applying ultrasonic vibration, because the energy of ultrasonic wave can be increased higher than the related art, the die shear strength can be increased higher than the related art, and sufficient bonding strength can be ensured even with a moderate accuracy of the bump height, and further requirements of the stiffness and accuracy of the production equipments for ultrasonic bonding can be moderated.

In addition, since boards made of glass-epoxy-based materials can be used, cost of electric circuit devices can be reduced.

Second Embodiment

In the second embodiment, same as the first embodiment, a semiconductor device as shown in the sectional view of FIG. 1A and the plan view of FIG. 1B is to be mounted.

To surround the periphery of the electric circuit pattern of a semiconductor chip 10 of for example an area of 3 mm×3 mm and a thickness of 0.3 mm, pad electrodes 11 are formed of for example aluminum or others near the periphery so as to be connected with the electric circuit pattern.

The forming surface of the pad electrodes 11 is covered by a not shown surface protection film comprised of for example a silicon nitride film or a polyimide film, leaving openings at places where the pad electrodes 11 are located.

At these openings, bumps 12 are formed of gold or other conductive materials, and are arranged in square shapes as the arrangements in FIG. 9A. For example, in case of gold stud bump (gold 99.99%), bumps that are 70 to 80 μm in diameter and about 50 μm in height can be formed using gold wires by means of wire bonding. The number of bumps per semiconductor chip is for example 75.

In this way, a peripheral pad semiconductor chip 1 is formed.

Same as the first embodiment, in the mounting board 2 on which the semiconductor device 1 is mounted, and at the places corresponding to the forming positions of bumps 12 of the semiconductor device 1 that is to be mounted on the upper surface of the board 20 comprised of for example a glass-epoxy-based or ceramic-based material, lands 21 (electrode) each being for example about 50 μm in width are formed by covering nickel and gold or other platings on pieces of conductive layers comprised of for example copper or others. Not shown printed wires are provided which are connected to the lands 12 and are formed on the front or back surface, or both of the front and back surfaces of the board 20.

Figure 19:
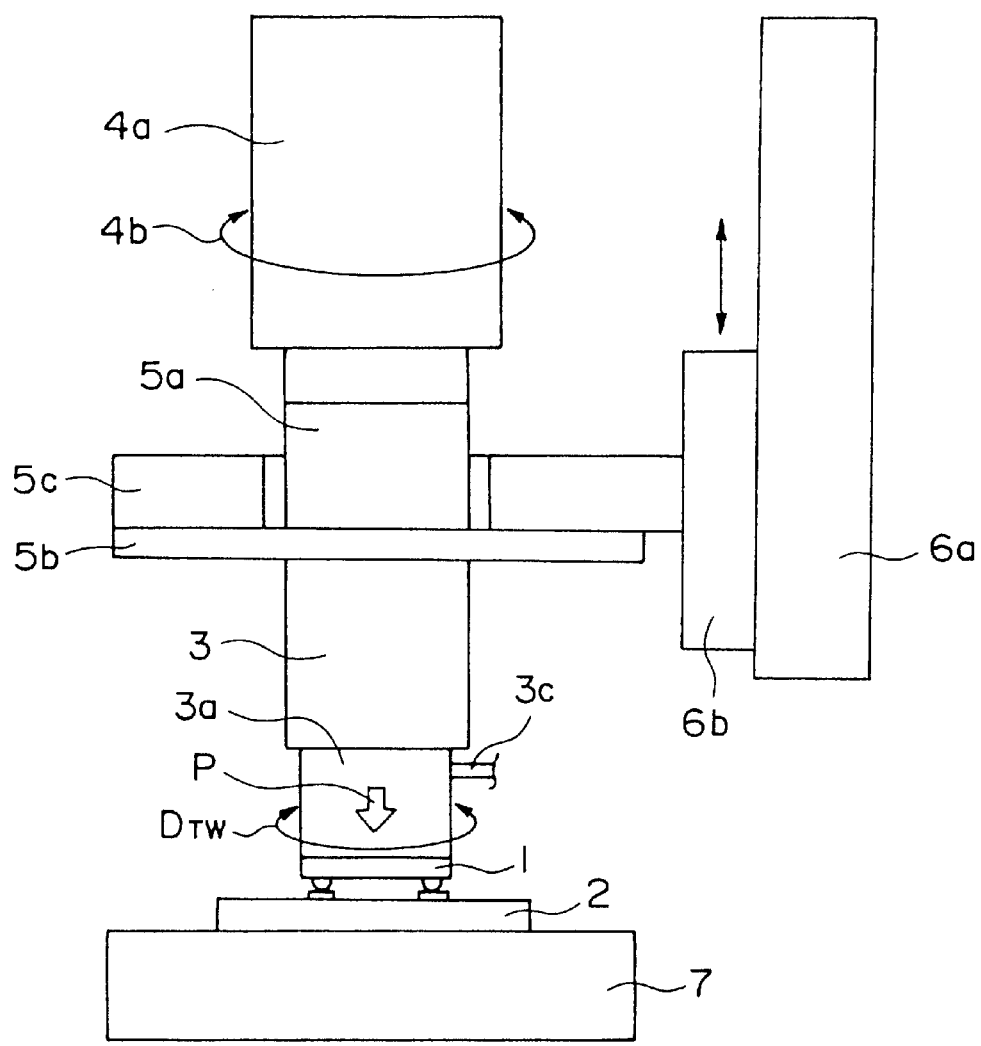
FIG. 19 is a schematic view of the configuration of a vertical ultrasonic vibration application apparatus used in the second embodiment.

To mount the above semiconductor chip, ultrasonic bonding is performed using the apparatus for applying ultrasonic vibration, whose schematic configuration is shown in FIG. 19.

Above a holder 5a, a twisted vibrator 4 is mounted, whereas below the holder 5a, a horn 3 is attached. At the lower end of the horn 3, a bonding tool 3a is provided. A not shown sucking hole is formed on the absorption surface of the bonding tool 3a for absorbing a semiconductor chip, and an attracting means such a pump is connected to the sucking hole via an sucking path inside the bonding tool 3a or an sucking pipe 3c in communication therewith, hence there is a mechanism able to absorb a semiconductor chip.

A flange 5b is provided at the part becoming a node of twisted vibration and is connected with the holder 5a. Further, a supporting bracket 5c is provided and is connected with the holder 5a. The supporting bracket 5c is attached to a moving table 6b of an up-down driving apparatus 6a.

In addition, the moving table 6b of the up-down driving apparatus 6a has such a structure that when it is at rest, it imposes a downward load in the reference of FIG. 19.

The above apparatus for applying ultrasonic vibration is a vertical ultrasonic vibration application apparatus that propagates twisted vibration 4b generated by the twisted vibrator 4 to a semiconductor chip absorbed onto the absorption surface at the end of the bonding tool 3a.

Explained below is the method for mounting the semiconductor 1 to the mounting board 2 by means of ultrasonic bonding using the above apparatus.

Figure 20:
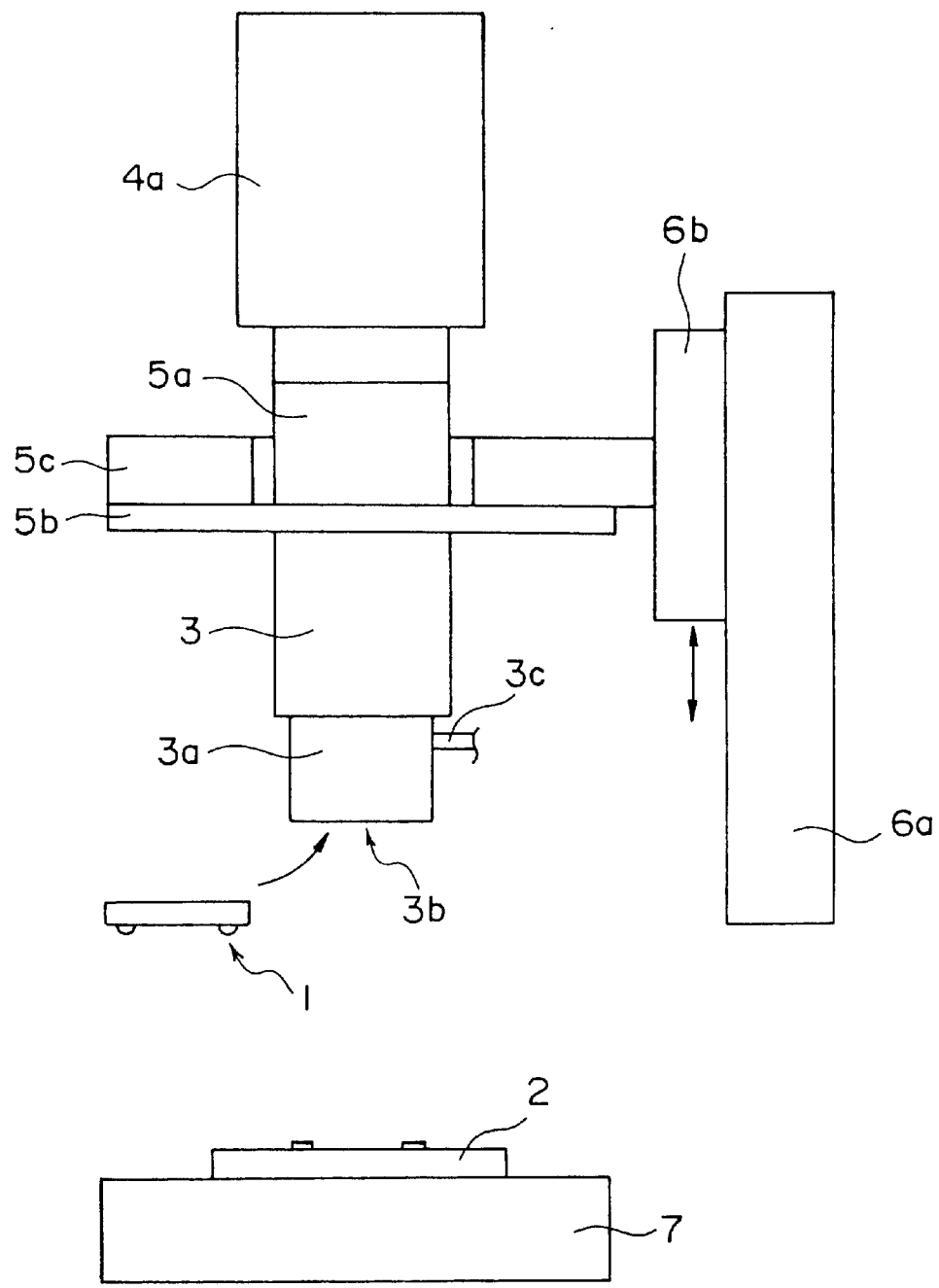
FIG. 20 is a schematic view showing the process of making the vertical ultrasonic vibration application apparatus of FIG. 19 absorb a semiconductor chip.

First, as shown in FIG. 20, in a state that the moving table 6b is moved to the upper part of the up-down driving apparatus 6a, the semiconductor chip 1 is supplied to the absorption surface of the bonding tool 3a wherein the sucking hole 3b is provided. By making into action the attracting means such as a pump connected to the sucking hole 3b, bumps of the semiconductor device 1 are made to face the lands of the mounting board, and the upper surface of the semiconductor device 1 is absorbed and retained by the absorption surface.

Next, the mounting board 2 is placed at a specified position on the platform 7, and the positions of the bumps of the semiconductor device 1 and lands of the mounting board 2 are confirmed using a not shown optical apparatus, and their positions are aligned. Next, the up-down driving apparatus is taken into action, and the moving table 6b is moved until the bumps and lands are in contact.

At this time, as shown in FIG. 19, due to the movement of the moving tale 6b, a downward load of a preset weight is imposed on the semiconductor device 1 in the reference of FIG. 19. Therefore, heads of bumps of the semiconductor device 1 are pressed against the lands of the mounting board 2 by the load P.

Next, the twisted vibrator 4a is made into operation to generate twisted vibration 4b. The twisted vibration 4b is propagated through the holder 5a, horn 3 and bonding tool 3a, and twisted vibration in the $D_{TW}$ direction is applied to the semiconductor device 1.

At this time, since the holder 5a is at a node position of the twisted vibration, even twisted vibration takes place, the amplitude of the twisted vibration near the holder 5a is small.

Figure 21A:
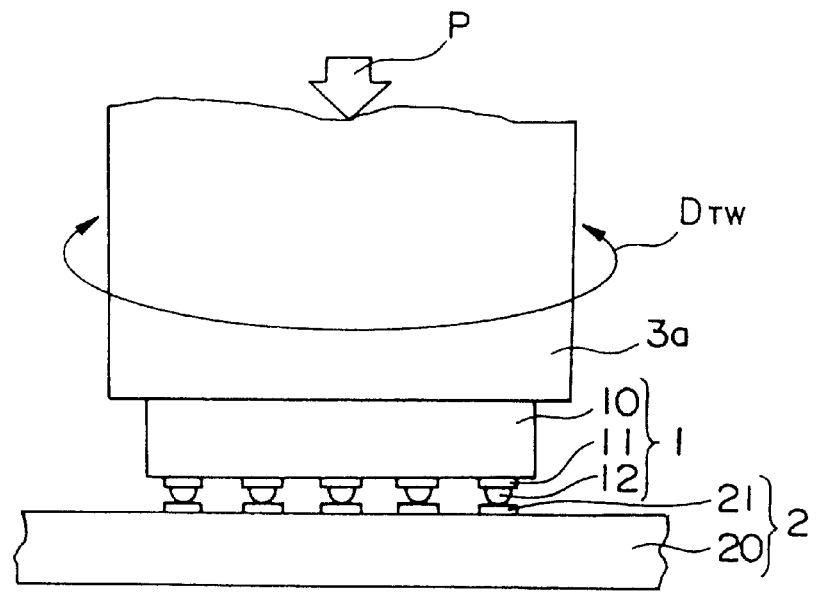
Figure 21B:
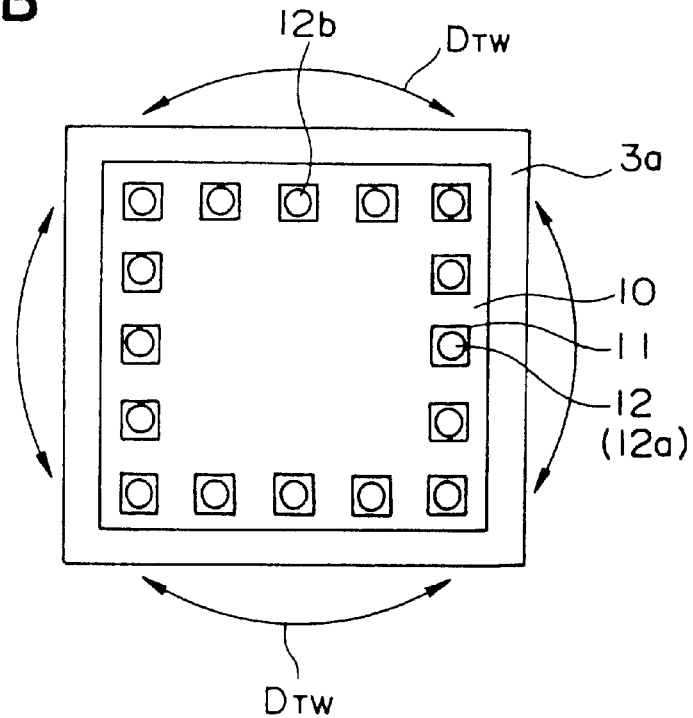
FIG. 21B is a plan view of the core of the same.

FIG. 21A is an enlarged side view of the semiconductor chip portion when twisted vibration is applied in the $D_{TW}$ direction to the above semiconductor device 1, while FIG. 21B is a plan view of the core of the same.

A pressure P is imposed on the upper surface of the semiconductor device 1 through the bonding tool 3a, in a state that the bumps 12 and the lands 21 are in close contact, ultrasonic vibration including twisted vibration in the $D_{TW}$ direction is generated by the twisted vibrator 4a connected to the horn 3.

At this time, while the amplitude in the $D_{TW}$ direction is increased by the horn 3, ultrasonic vibration is applied to the places in close contact between bumps 12 and lands 21.

In this process, frictional heat is produced at the places in close contact between bumps 12 and lands 21 as a result of application of ultrasonic vibration.

Because of the friction, adhesions or an oxide film formed on the surfaced of the bumps 12 and the lands 21 are destroyed, and the surfaced are flattened. Moreover, bumps 12 are crushed and deformed because of the influence of the load and vibration, and at last bumps 12 and lands 21 are heated because of the heat caused by frictions and are bonded in solid phase by diffusion or diffusion to each other.

In this way, as in the first embodiment, an electric circuit device is able to be fabricated in which the semiconductor device 1 is mounted on the mounting board 2, as shown in the sectional view of FIG. 7A and the enlarged view of FIG. 7B.

If the semiconductor chip has a size larger than 10 mm×10 mm, or the width of the wires on the mounting board is broad, because the frictional heat dissipates away drastically through the upper surface of the semiconductor chip or the internal wires of the mounting board, the temperature of the bonding surfaces of the bumps and lands are not raised sufficiently, and sometimes the solid phase bonding cannot be made.

As a measure against this problem, by preheating the bonding tool 3a or the platform 7 to 100 to 200° C., dissipation of the frictional heat during application of ultrasonic vibration can be effectively prevented.

Modification

The weight of the load most suitable for the ultrasonic bonding is about 100 g per bump Therefore, as the number of bumps in one semiconductor device 1 increases, the weight of the load imposed on the semiconductor device has to be increased. As a result, the static frictional force between the semiconductor device and the mounting board increases.

Generally, if the number of bumps in one semiconductor device 1 is greater than 200, even twisted vibration due to ultrasonic wave is applied to a semiconductor device, sometimes sliding occurs between the heads of bumps and lands, and friction does not happen.

Figure 22:
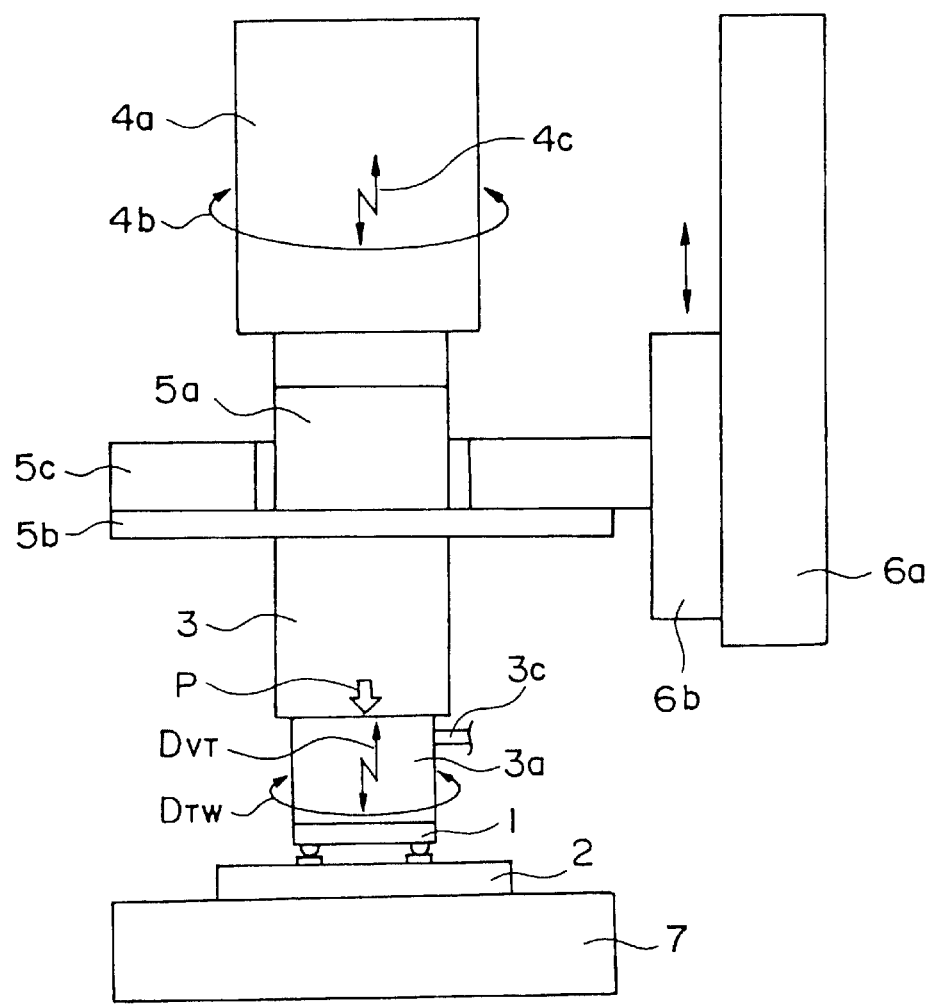
FIG. 22 is a schematic view of a modification of the vertical ultrasonic vibration application apparatus used in the second embodiment.

In this case, it is preferable to use the vertical ultrasonic vibration application apparatus shown in FIG. 22.

Although substantially it is the same as the apparatus shown in FIG. 19, the apparatus in FIG. 22 is different in the aspect that the twisted vibrator 4a is a complex vibrator capable of generating a vertical vibration (vibration in the direction of the normal direction of the mounting board) 4c in addition to the twisted vibration 4b.

In addition to the twisted vibration 4b, the vertical vibration 4c is propagated to the bonding tool, and twisted vibration in the $D_{TW}$ direction and vertical vibration in the $D_{VT}$ direction are generated, and stable sliding friction can be generated between heads of the bumps and the lands.

The above method is particularly effective when boards made of glass-epoxy or other relatively soft materials are used as the mounting boards.

According to the present embodiment, as in the first embodiment, the dragging force acting on each bump can be uniformed during application of ultrasonic vibration, and an electric circuit device can be fabricated without occurrence of cratering or other mechanical damages while ensuring sufficient bonding strength.

In addition, in the method for fabricating an electric circuit according to the present embodiment, the horn 3 and the twisted vibrator 4a are provided right above the semiconductor device 1, this enables eliminating the defect of the conventional single support type ultrasonic application apparatus that the horn 3 is bended and the parallelism between the semiconductor device 1 and the mounting board 2 changes when a weight is imposed to the semiconductor device 1.

In addition, the vertical ultrasonic vibration application apparatus used in the present embodiment has an advantage that its design and fabrication is easier than the conventional double support type ultrasonic vibration application apparatus.

In the present embodiment, as the first embodiment, bump arrangement patterns of various shapes are applicable.

In the method for fabricating an electric circuit device according to the present invention, as the semiconductor device mounted on the mounting board, MOS transistor semiconductor devices, bipolar semiconductor devices, BiCMOS semiconductor devices, semiconductor devices embedded with logic and memories, and so on, any semiconductor devices are applicable.

The method for fabricating an electric circuit device according to the present invention is not limited to the above embodiments.

For example, as bumps, other materials than gold may be used.

The location to arrange the pad electrodes is not limited to the peripheral region of a semiconductor chip.

The direction of ultrasonic vibration, in addition to a diagonal direction of a semiconductor chip, may be set to be any direction that making uniform the dragging force acting on each bump.

Numerous modifications else could be made without departing from the basic concept and scope of the present invention.

Summarizing the effects of the invention, according to the method for fabricating an electric circuit device according the present invention, even especially when boards made of glass-epoxy-based or other materials having low hardness are used as the mounting boards, bump bonding is able to be made ensuring necessary bonding strength without occurrence of cratering or other mechanical damages at places of all pads in electric connection.

What is claimed is:

1. A method for fabricating an electric circuit device wherein a semiconductor device having a plurality of bumps formed in an approximate polygonal shape or in a straight line arrangement is mounted on a mounting board having electrodes, comprising steps of:

aligning the bumps with the electrodes and placing the semiconductor device on the mounting board and while making the bumps and the electrodes contact closely, applying ultrasonic vibration to the semiconductor device in a direction not parallel with any side of the approximate polygon formed by the arranged bumps or in a direction not parallel with the straight line formed by the arranged bumps.

2. A method for fabricating an electric circuit device as set forth in claim 1, wherein said application direction of ultrasonic vibration on said semiconductor device is such a direction that the dragging force acting on each bump is uniformed during application of ultrasonic vibration.

3. A method for fabricating an electric circuit device as set forth in claim 2, wherein said application direction making the dragging force acting on each bump uniform is such a direction that the distance between two bumps along the application direction of ultrasonic vibration is longer than the minimum distance between two bumps.

4. A method for fabricating an electric circuit device as set forth in claim 1, wherein said bumps are arranged in an approximate rectangle on said semiconductor device, and said application direction of ultrasonic vibration on the semiconductor device is the direction of a diagonal of the semiconductor device.

5. A method for fabricating an electric circuit device as set forth in claim 1, wherein a mounting board comprising a board made of glass-epoxy-based or other materials and wires formed thereon is used as said mounting board.

6. A method for fabricating an electric circuit device as set forth in claim 1, wherein twisted vibration is used as the method of applying ultrasonic vibration to the semiconductor device in a direction not parallel with any side of the approximate polygon formed by the arranged bumps, or in a direction not parallel with the straight line formed by the arranged bumps.

7. A method for fabricating an electric circuit device as set forth in claim 1, wherein complex vibration including vibration in the normal direction of said mounting board superposed on said twisted vibration is used as the method of applying ultrasonic vibration to said semiconductor device.

* * * * *